United States Patent
Lee et al.

(10) Patent No.: US 6,946,349 B1
(45) Date of Patent: Sep. 20, 2005

(54) METHOD FOR INTEGRATING A SONOS GATE OXIDE TRANSISTOR INTO A LOGIC/ANALOG INTEGRATED CIRCUIT HAVING SEVERAL GATE OXIDE THICKNESSES

(75) Inventors: Jae Gon Lee, Singapore (SG); Hwa Weng Koh, Singapore (SG); Elgin Quek, Singapore (SG); Dong Kyun Sohn, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/914,563

(22) Filed: Aug. 9, 2004

(51) Int. Cl.⁷ .......................................... H01L 21/8234
(52) U.S. Cl. .................... 438/275; 438/287; 438/288; 438/591; 438/761; 438/763; 438/954; 438/981
(58) Field of Search ................................ 438/200, 275, 438/287, 288, 591, 761, 763, 954, 981, FOR 395, 438/FOR 490, FOR 496

(56) References Cited

U.S. PATENT DOCUMENTS

| | | | |
|---|---|---|---|
| 6,362,059 B2 * | 3/2002 | Fukasaku et al. .......... | 438/289 |
| 6,531,350 B2 | 3/2003 | Satoh et al. ................ | 438/197 |
| 6,555,436 B2 * | 4/2003 | Ramsbey et al. ........... | 438/279 |
| 6,677,200 B2 * | 1/2004 | Lee et al. ................... | 438/257 |
| 6,787,421 B2 * | 9/2004 | Gilmer et al. .............. | 438/275 |
| 2003/0032242 A1 * | 2/2003 | Lee et al. ................... | 438/257 |
| 2003/0155582 A1 | 8/2003 | Mahajani et al. ........... | 257/200 |
| 2004/0018685 A1 | 1/2004 | Shibata ....................... | 438/261 |
| 2004/0021171 A1 | 2/2004 | Nishizaka ................... | 257/315 |
| 2004/0110390 A1 * | 6/2004 | Takagi et al. ............... | 438/710 |
| 2004/0137686 A1 * | 7/2004 | Chen et al. ................. | 438/287 |
| 2004/0157393 A1 * | 8/2004 | Hwang ........................ | 438/257 |

* cited by examiner

Primary Examiner—George Fourson
Assistant Examiner—Michelle Estrada
(74) Attorney, Agent, or Firm—George O. Saile; Rosemary L. S. Pike; Stephen B. Ackerman

(57) ABSTRACT

A method for integrating a SONOS device with an improved top oxide with $SiO_2$ gate oxides of different thickness is described. In a first embodiment during ISSG oxidation to form the $SiO_2$ gate oxides, a thin sacrificial silicon nitride layer is used over the top oxide of the ONO to minimize loss and to control the top oxide thickness. In a second embodiment the top oxide layer for the SONOS device is formed by depositing an NO stack. During ISSG oxidation to form the $SiO_2$ gate oxides a portion of the $Si_3N_4$ in the NO stack is converted to $SiO_2$ to form the top oxide with improved thickness control.

20 Claims, 5 Drawing Sheets

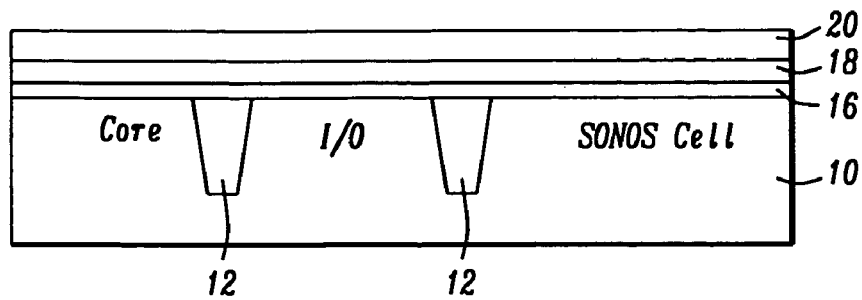
FIG. 1 – Prior Art
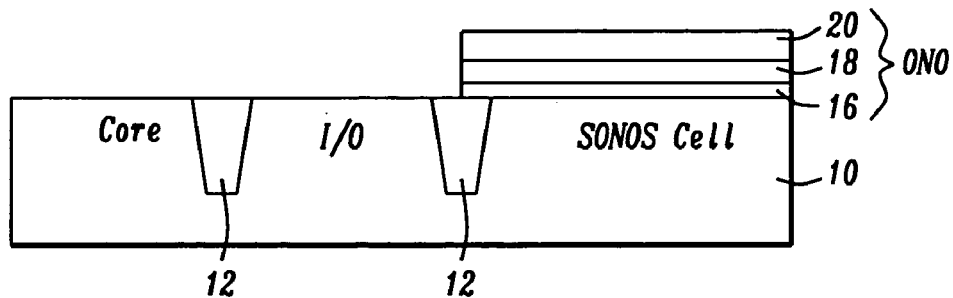
FIG. 2 – Prior Art
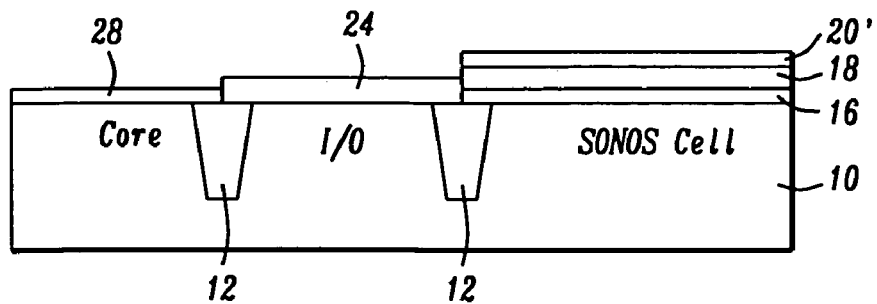
FIG. 3 – Prior Art

METHOD FOR INTEGRATING A SONOS GATE OXIDE TRANSISTOR INTO A LOGIC/ANALOG INTEGRATED CIRCUIT HAVING SEVERAL GATE OXIDE THICKNESSES

BACKGROUND OF THE INVENTION (1) Field of the Invention

This invention relates to semiconductor integrated circuit devices, and more particularly to a method for controlling the top oxide thickness on a polysilicon/silicon oxide/silicon nitride/silicon oxide/silicon substrate (SONOS) transistor while forming gate oxides of different thicknesses elsewhere on the substrate by a first and second embodiment. The method and structure are particularly suitable for integrating merged logic/analog integrated circuits with non-volatile memory devices.

(2) Description of the Prior Art

Merging semiconductor logic/analog devices with non-volatile memory devices is finding extensive use in the electronics industry. These embedded SONOS devices require FETs with different gate oxide thicknesses to optimize the FET performance. Typically non-volatile memory (SONOS) and peripheral input/output (I/O) devices require thicker gate oxides, while CMOS logic/analog devices require a thinner gate oxide for increased performance (switching speed). For example, SONOS memory and peripheral devices require thicker oxides of about 60 Angstroms or more and operate at a gate voltage of about 3.0 to 5.0 volts, while CMOS logic devices have gate oxides that are about 35 Angstroms or less and operate at lower gate voltages (V) of between about 1.8 V and 2.5 V to achieve higher switching speeds.

One conventional method of achieving dual-thickness gate oxides for FETs while forming a silicon oxide/silicon nitride/silicon oxide (ONO) layer on a substrate is depicted in the schematic cross-sectional views of FIGS. 1 and 2. In this approach a field oxide 12 is formed in and on the silicon substrate 10 to surround and electrically isolate the various device areas. The logic/analog device area (core area) is depicted in the left portion of FIG. 1, the I/o area is depicted in the center portion, and the SONOS area is depicted in the right portion of FIG. 1. For simplicity and purpose of discussion, the three device areas are depicted adjacent to each other; however, it should be understood that the device areas can be distributed differently on the substrate depending upon the circuit design.

In this conventional approach a blanket stacked layer is formed on the substrate. The stacked layer consists of a first silicon oxide ($SiO_2$) layer 16, a silicon nitride ($Si_3N_4$) layer 18, and a top $SiO_2$ layer 20, as shown in FIG. 1. As shown in FIG. 2, the stacked ONO layer is patterned to leave portions over the SONOS memory (cell) area. Then, as shown in FIG. 3, a first gate oxide 24 is grown over the core and I/O device areas and is patterned to leave the first gate oxide 24 over the I/O device areas, and a second gate oxide 28 is grown over the core area. Unfortunately, during processing to form the first and second gate oxides, the effects of cleaning and oxidizing can dramatically alter the thickness of the top $SiO_2$ layer 20'.

Various methods of integrating SONOS or MONOS devices on a substrate have been reported in the literature. For example, U.S. Pat. No. 6,531,350 B2 to Satoh et al. describes a method for making twin MONOS devices on opposite sidewalls of a word line while simultaneously forming the memory gate and the logic gate. Nishizaka in U.S. Pat. No. 2004/0021171 A1 describes a method for making a non-volatile two-bit (node) device, with a node on each side of a polysilicon gate electrode. In U.S. Pat. No. 2004/0018685 A1 to Shibata, a method is described for making a non-volatile memory cell, with nodes adjacent to and on opposite sides of a polysilicon gate electrode. U.S. Pat. No. 2003/0155582 A1 to Mahajani et al. describes a method for making very thin gate oxides using a low-temperature in-situ steam generation process. The cited references do not address the problem of variations in the thickness of the top $SiO_2$ on a SONOS device.

Therefore there is a need in the industry to provide a method that minimizes variations in the thickness of top $SiO_2$ on SONOS devices when integrating SONOS devices with FETs having gate oxides of several different thicknesses on the same substrate.

SUMMARY OF THE INVENTION

A principal object of the present invention is to form an ONO stacked gate for a SONOS transistor with a top oxide that has a uniform and repeatable thickness and is integrated into a single integrated circuit having gate oxides of different thicknesses.

Another object of the invention by a first embodiment is to achieve this top oxide having uniform and repeatable thickness by using a thin sacrificial $Si_3N_4$ layer over the top $SiO_2$ layer during processing to form gate oxides of different thicknesses elsewhere on the substrate.

Another objective of this invention by a second embodiment is to utilize a silicon nitride/silicon oxide (NO) layer over the SONOS cell area in which the $Si_3N_4$ layer is partially converted to a $SiO_2$ during processing to form ONO gate oxides while forming gate oxides having different thicknesses on other portions of the substrate.

Still another objective of this invention is to provide a simple manufacturing process that is more reliable and more cost effective.

This invention provides a method of controlling and minimizing the variation in thickness of the top oxide on a polysilicon/silicon oxide/silicon nitride/silicon oxide/silicon substrate (SONOS) device. This method of minimizing the thickness variation of the top oxide is achieved by using a thin sacrificial $Si_3N_4$ layer on the top of a silicon oxide/silicon nitride/silicon oxide (ONO) stacked layer. The sacrificial $Si_3N_4$ layer protects the top $SiO_2$ layer from thickness variations on the SONOS devices during the formation of first and second gate oxides on other portions of the substrate.

In brief the method begins by providing a partially completed semiconductor substrate having implanted regions for wells and drains for core regions, input/output (I/O) regions, and SONOS cell regions surrounded by isolation areas. A blanket stacked layer of a $SiO_2$ layer, a storage $Si_3N_4$ layer, and a top $SiO_2$ layer (ONO layer) is formed sequentially on the substrate. A key feature of the invention is to form a sacrificial $Si_3N_4$ layer on the top $SiO_2$ layer of the ONO stacked layer. The sacrificial $Si_3N_4$ layer and the stacked ONO layer are patterned to leave portions of the ONO layer with the sacrificial $Si_3N_4$ layer over the SONOS cell regions. A first gate oxide is formed, for example, by in-situ steam generation (ISSG) oxidation process, on the exposed surface of the substrate over the core (logic) regions and the I/O regions. The sacrificial $Si_3N_4$ layer is partially oxidized to form a sacrificial $SiO_2$ layer. The sacrificial $Si_3N_4$ layer prevents the thickness of the top oxide layer of the ONO layer from changing during processing when the first gate oxide is formed. Next the first gate oxide is patterned to leave portions over the I/O regions while removing the first gate oxide over the core regions. The remaining sacrificial $Si_3N_4$ layer protects the top oxide layer while removing the sacrificial $SiO_2$ layer over the SONOS. Next a second gate oxide is formed on the substrate over the core regions while concurrently oxidizing the remaining sacrificial $Si_3N_4$ layer to complete the stacked ONO layer for the SONOS memory cell, and to complete the first gate oxide and the second gate oxide. The remaining sacrificial $Si_3N_4$ layer that is oxidized also forms a portion of the top oxide layer.

In a second embodiment of this invention, the method is similar to the first embodiment up to the formation of the bottom $SiO_2$ layer. A storage $Si_3N_4$ layer is deposited sufficiently thick to allow a top oxide layer to be formed by thermal oxidation of the $Si_3N_4$ layer during formation of a first and second gate oxide. Briefly the bottom $SiO_2$ layer and the storage $Si_3N_4$ layer are patterned to leave portions over the SONOS cell regions. Next the first gate oxide is formed over the core area and the I/O area using thermal oxidation while the storage $Si_3N_4$ layer over the SONOS cell is partially oxidized to form a portion of the top oxide layer. The first gate oxide is then patterned to leave portions over the I/O area while protecting the partially completed top $SiO_2$ from etching. A second gate oxide is formed over the core regions while concurrently increasing the thickness of the top $SiO_2$ layer to complete the stacked ONO layer for the SONOS memory cell while completing the first gate oxide and the second gate oxide, each of a different thickness.

BRIEF DESCRIPTION OF THE DRAWINGS

FIGS. 1–3 show schematic cross-sectional views for conventional processes and structure depicting the current problem in controlling the top oxide thickness on a SONOS storage device while making gate oxides of different thicknesses on the same substrate.

DESCRIPTION OF THE PREFERRED EMBODIMENTS

The method is now described in detail by a first embodiment for making a SONOS storage device with a top oxide having minimum loss and variation while making gate oxides of two different thicknesses on the same substrate. Although this invention is described for a planar gate structure, it is also applicable to non-planar structures such as dual-sidewall gate structures and the like.

Figure 4:
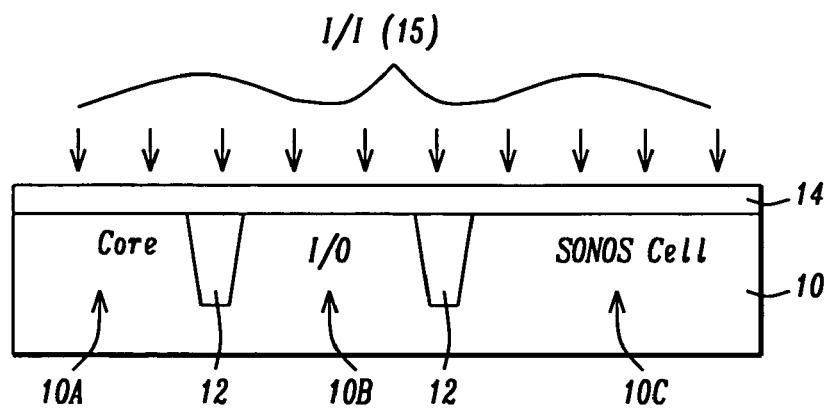
FIGS. 4 through 8 show schematic cross-sectional views, by a first embodiment of this invention, for a process using a novel thin sacrificial $Si_3N_4$ layer to control the thickness of a top oxide on a SONOS device while making gate oxides of different thickness on the same substrate.

Referring now to FIG. 4, the method begins by providing a substrate 10 having logic (core) regions 10A for logic circuits, I/O regions 10B, and SONOS cell areas (non-volatile memory) 10C. Although the device regions are shown adjacent to each other to simplify the drawings, the actual distribution of these regions depends on the circuit design (layout). The different regions are typically electrically isolated from each other by using shallow trench isolation 12. An implant sacrificial layer 14 is deposited or formed on the substrate 10 for implanting the wells and channels. Sacrificial layer 14 is typically $SiO_2$ and is formed to a thickness of about 100 Angstroms. The wells and channels (not shown) are formed by ion implantation, labeled I/I (15), as depicted by the vertical arrows in FIG. 4.

Figure 5:
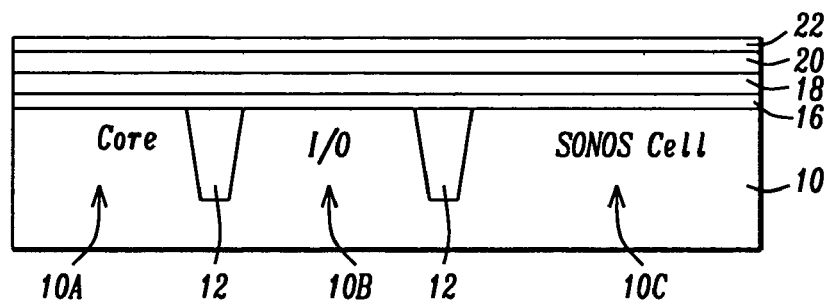

Referring to FIG. 5, after implanting the wells and channels, the implant sacrificial layer 14 is removed. For example, layer 14 can be removed by wet etching in a solution such as hydrofluoric acid and water. A blanket stacked layer is formed on the substrate 10. The stacked layer is made up of a bottom $SiO_2$ layer 16, a storage $Si_3N_4$ layer 18, and a top $SiO_2$ layer 20 (ONO layer). The bottom $SiO_2$ layer 16 is formed by thermal oxidation using, for example, rapid thermal oxidation (RTO) or ISSG, and is formed to a thickness of between about 30 and 50 Angstroms, and more specifically to a thickness of about 40 Angstroms. Next a $Si_3N_4$ layer 18 is deposited on the bottom oxide layer 16 by LPCVD, and using a reactant gas mixture of dichlorosilane and ammonia. Layer 18 is deposited to a preferred thickness of between about 70 and 90 Angstroms, and more specifically to a thickness of about 80 Angstroms. A top oxide layer 20 is then formed on the $Si_3N_4$ layer 18. Layer 20 is $SiO_2$ deposited, for example, using LPCVD using a reactant gas such as TEOS. Layer 20 is formed to a thickness of between about 30 and 50 Angstroms, and more specifically to a thickness of about 40 Angstroms.

Continuing with FIG. 5 and a key feature of the invention is to deposit a sacrificial $Si_3N_4$ layer 22 on the top $SiO_2$ layer 20 of the ONO stacked layer, and form a NONO stacked layer. The $Si_3N_4$ layer 22 is deposited to a thickness of between about 40 and 50 Angstroms, and more specifically to a thickness of about 45 Angstroms. Layer 22 can be deposited by LPCVD, and using a reactant gas mixture of dichlorosilane and ammonia.

Figure 6:
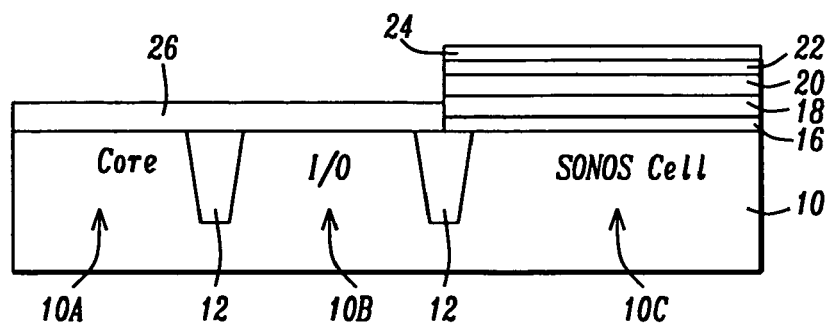
Figure 13:
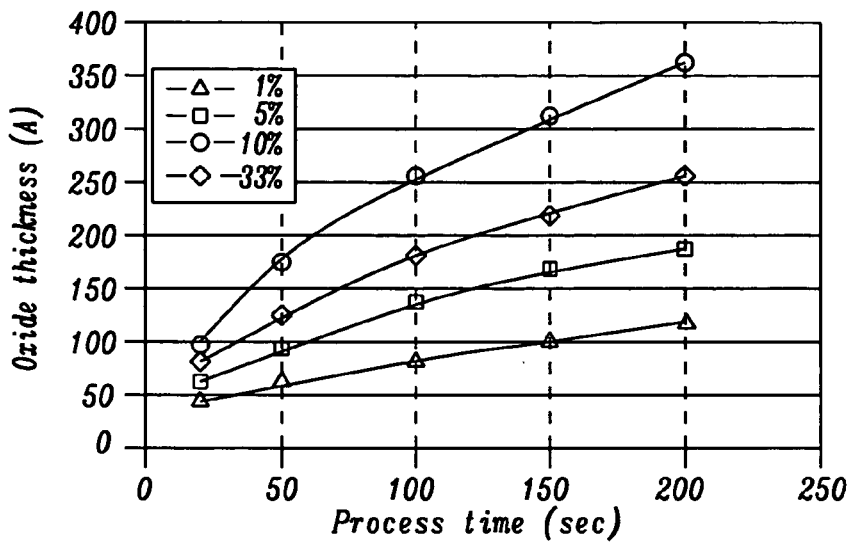
FIG. 13 is a graph of the oxide thickness as a function of the process time in an ISSG oxidation system in an $H_2O_2$ gas with different percentages of oxygen
Figure 14:
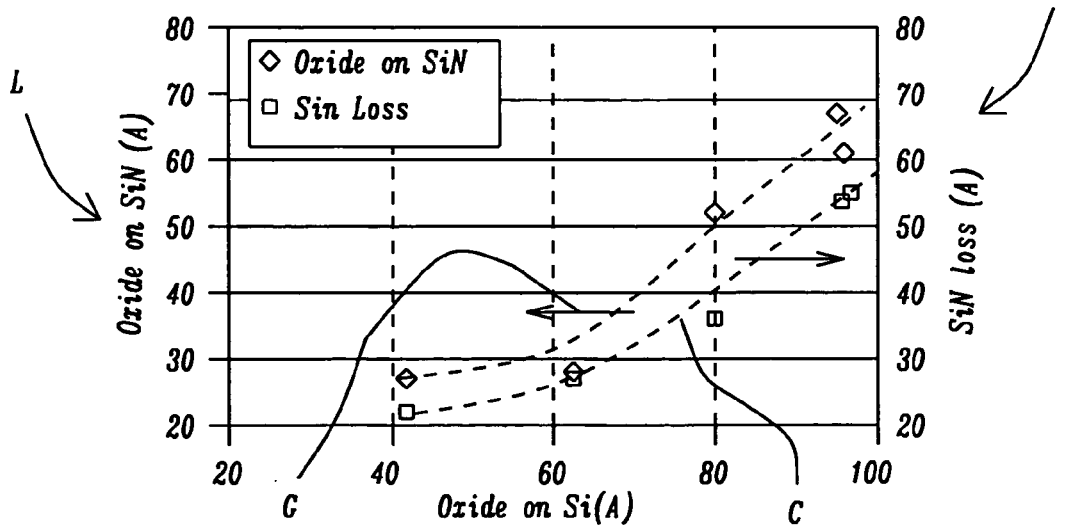
FIG. 14 is a graph of the oxide thickness and the consumption of a $Si_3N_4$ layer as a function of oxide thickness on a silicon substrate in an ISSG oxidation system.

Referring to FIG. 6, the sacrificial $Si_3N_4$ layer 22 and the stacked ONO layer (16, 18, 20) are patterned to leave portions of the ONO layer with the sacrificial $Si_3N_4$ layer 22 over the SONOS cell regions 10C. Layer 22 can be patterned using photolithography and plasma etching. A first gate oxide 26 is formed on the exposed surface of the substrate over the core (logic) regions 10A and the I/O regions 10B. Preferably the first gate oxide 26 is formed by in-situ steam generation (ISSG) oxidation process to a thickness of between about 50 and 70 Angstroms, and more specifically to a thickness of about 60 Angstroms. The process time in a typical ISSG oxidation system can be determined from a set of curves of oxide thickness versus process time, as shown in FIG. 13. Concurrently, during oxidation the sacrificial $Si_3N_4$ layer 22 is partially oxidized to form a sacrificial $SiO_2$ layer 24. The thickness of the oxide layer 24 can be determined from the curve G of oxide thickness formed on $Si_3N_4$ 22 versus $SiO_2$ thickness on the substrate, as shown in FIG. 14 by left coordinate axis L. The amount of silicon nitride of layer 22 that is consumed or lost is determined from curve C with respect to the right coordinate axis R of FIG. 14. An important feature of the invention is that the remaining sacrificial $Si_3N_4$ layer 22 prevents the thickness of the top oxide layer 20 of the ONO layer from changing during processing when forming the first gate oxide 26.

Figure 7:
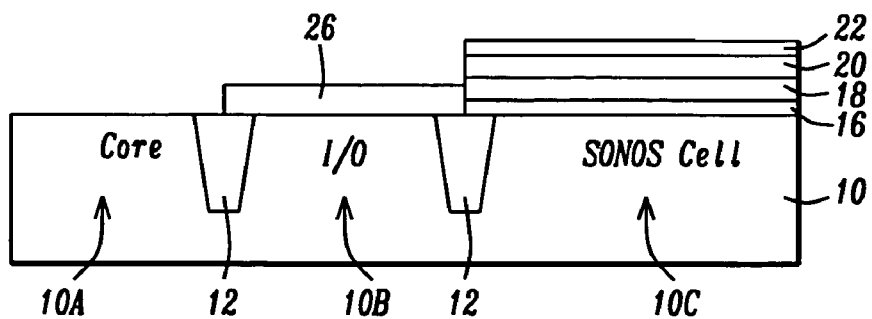

Referring to FIG. 7, the first gate oxide 26 is patterned to leave portions over the I/O regions 10B while removing the first gate oxide 26 over the core regions 10A. The sacrificial oxide 24 is also removed. The patterning is achieved, for example, by using a buffered hydrofluoric acid dip. The remaining sacrificial $Si_3N_4$ layer 22 protects the top oxide layer 20 while removing the sacrificial $SiO_2$ layer 24 over the SONOS cells 10C.

Figure 8:
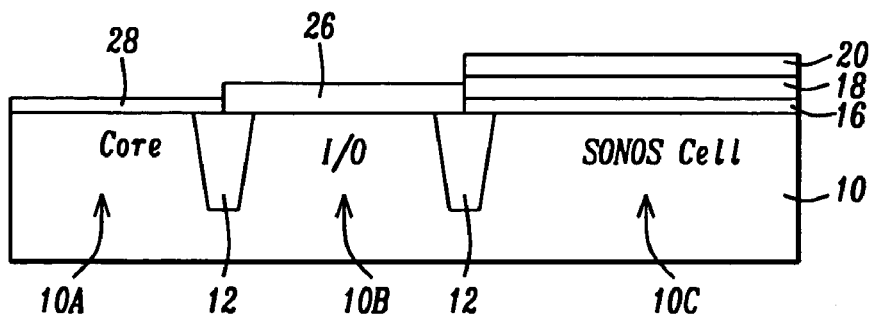

Referring now to FIG. 8, a second gate oxide 28 is formed on the substrate over the core regions 10A while concurrently oxidizing the remaining sacrificial $Si_3N_4$ layer 22 to complete the stacked ONO layer for the SONOS memory cell 10C, and to complete the first gate oxide 26 and the second gate oxide 28. The second gate oxide 28 is formed preferably by ISSG processing to a thickness of between about 30 and 40 Angstroms, and more specifically to a thickness of about 35 Angstroms. The remaining sacrificial $Si_3N_4$ layer 22 that is oxidized during this process step also forms a portion of the top oxide layer 20 and completes the SONOS gate structure oxides with improved top oxide thickness control while concurrently forming gate oxides of different thicknesses elsewhere on the substrate.

Figure 9:
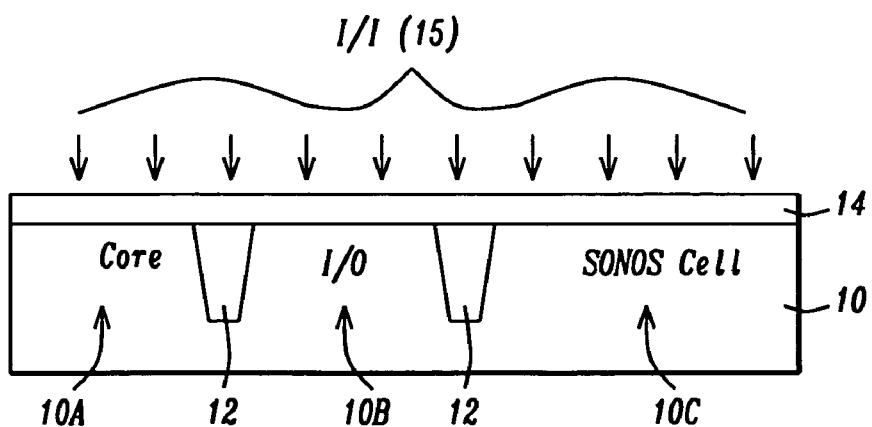
FIGS. 9 through 12 show schematic cross-sectional views, by a second embodiment of this invention, for a process using a novel thick $Si_3N_4$ layer and thermally oxidizing to form a top oxide on a SONOS device while making gate oxides of different thicknesses on the same substrate.

Referring to FIG. 9, which is the same as FIG. 4, a second embodiment of this invention also starts by forming a sacrificial $SiO_2$ layer 14 and doing an ion implant, indicated by the vertical arrows labeled I/I (15) to form wells and channels (not labeled), as in the first embodiment.

Figure 10:
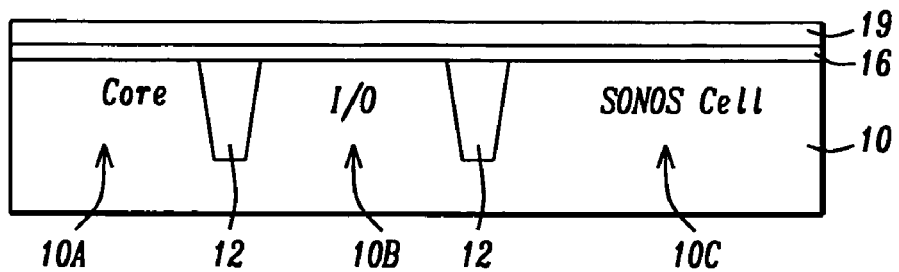

Referring to FIG. 10, a first oxide layer 16 (bottom oxide) is formed by rapid thermal oxidation (RTO) or in-situ steam generation (ISSG) oxidation process to a thickness of between about 30 and 50 Angstroms, and more specifically to a thickness of about 40 Angstroms. A $Si_3N_4$ layer 19 is deposited on the bottom oxide layer 16. Layer 19 is deposited to a preferred thickness of between about 110 and 140 Angstroms, and more specifically to a thickness of about 125 Angstroms. The $Si_3N_4$ layer 19 is deposited sufficiently thick to allow a top oxide layer to be formed by thermal oxidation of the $Si_3N_4$ layer 19 during formation of first and second gate oxides.

Figure 11:
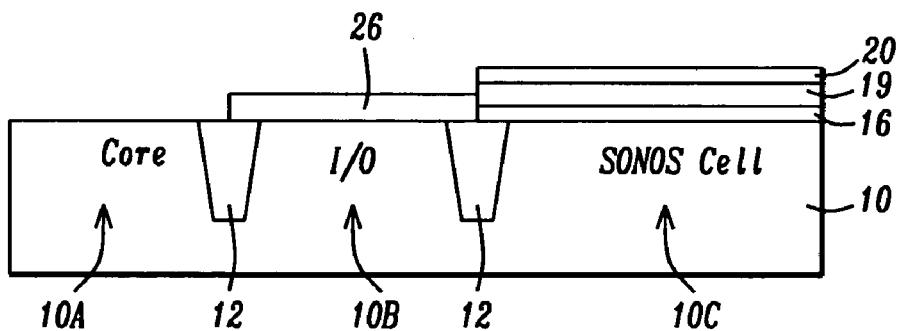

Referring to FIG. 11, the $SiO_2$ layer 16 and the $Si_3N_4$ layer 19 are patterned to leave portions over the SONOS cell regions 10C while exposing the substrate surface over the core regions 10A and I/O regions 10B.

Still referring to FIG. 11, a first gate oxide 26 is formed over the core area 10A and the I/O area 10B using thermal oxidation such as ISSG oxidation process, while the $Si_3N_4$ layer 19 over the SONOS cell 10C is partially oxidized to form a portion of the top oxide layer 20, as determined from the oxidation/nitride-consumption curves in FIG. 14. For example, when a first gate oxide is grown to a thickness of about 60 Angstroms, the top surface of the $Si_3N_4$ layer 19 is oxidized to a thickness of about 35 Angstroms, while the thickness of silicon nitride consumed is about 25 Angstroms.

Continuing with FIG. 11, the first gate oxide 26 is then patterned to leave portions over the I/O area 10B while protecting the partially completed top $SiO_2$ layer 20 from etching.

Figure 12:
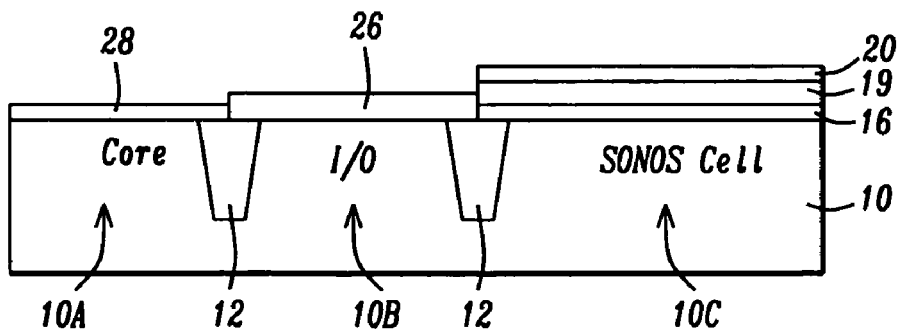

Referring next to FIG. 12, a second gate oxide 28 is formed over the core regions 10A, also by ISSG oxidation, while concurrently increasing the thickness of the top $SiO_2$ layer 20, as determined from the oxidation curves shown in FIG. 14. The second gate oxide 28 is formed to a thickness of about 35 Angstroms while the thickness of the top $SiO_2$ 20 is increased from about 35 Angstroms to about 60 Angstroms to complete the stacked ONO layer for the SONOS memory cell 10C while completing the first gate oxide 26 and the second gate oxide 28, each of a different thickness.

While the invention has been particularly shown and described with reference to the preferred embodiments thereof, it will be understood by those skilled in the art that various changes in form and details may be made without departing from the spirit and scope of the invention.

What is claimed is:

1. A method for integrating the fabrication of a SONOS memory cell with gate oxides of different thicknesses comprising the steps of:
    providing a semiconductor substrate having implanted regions for wells and drains for core regions, input/output (I/O) regions, and SONOS cell regions surrounded by isolation areas;
    forming sequentially a blanket silicon oxide layer, a storage silicon nitride layer, and a top silicon oxide layer (ONO layer) on said substrate;
    forming a sacrificial silicon nitride layer on said top silicon oxide layer;
    patterning said sacrificial silicon nitride layer and said ONO layer leaving portions of said ONO layer with said sacrificial silicon nitride layer over said SONOS cell regions while exposing surface of said substrate over said core regions and said I/O regions;
    forming a first gate oxide (ISSG) on said exposed surface, while partially oxidizing said sacrificial silicon nitride layer to form a sacrificial silicon oxide layer while protecting said top silicon oxide layer;
    patterning said first gate oxide to leave portions over said I/O regions while concurrently removing said first gate oxide over said core regions and removing said sacrificial silicon oxide layer;
    forming a second gate oxide over said core regions while concurrently oxidizing remaining said sacrificial silicon nitride layer to complete said SONOS memory cell and said first gate oxide and said second gate oxide each of a different thickness.

2. The method of claim 1, wherein said semiconductor substrate is single crystal silicon.

3. The method of claim 1, wherein said blanket silicon oxide layer is formed on said substrate by rapid thermal oxidation (RTO) or in-situ steam generation (ISSG) oxidation process to a thickness of between 30 and 50 Angstroms.

4. The method of claim 1, wherein said storage silicon nitride is deposited by LPCVD using dichlorosilane and ammonia, and is formed to a thickness of between about 70 and 90 Angstroms.

5. The method of claim 1, wherein said top silicon oxide layer is deposited by LPCVD using TEOS and is formed to a thickness of between about 30 and 50 Angstroms.

6. The method of claim 1, wherein said sacrificial silicon nitride layer is deposited by LPCVD using dichlorosilane and ammonia, and is formed to a thickness of between about 40 and 50 Angstroms.

7. The method of claim 1, wherein said sacrificial silicon nitride layer is patterned using a photoresist mask and plasma etching.

8. The method of claim 1, wherein said first gate oxide is grown to a thickness of between 50 and 70 Angstroms.

9. The method of claim 1, wherein said first gate oxide is formed by ISSG while consuming a portion of said sacrificial silicon nitride layer to form said sacrificial silicon oxide layer.

10. The method of claim 1, wherein said second gate oxide is grown to a thickness of between 30 and 40 Angstroms.

11. The method of claim 1, wherein said second gate oxide is formed by ISSG.

12. A method for integrating the fabrication of a SONOS memory cell with gate oxides of different thicknesses comprising the steps of:
providing a semiconductor substrate having implanted regions for wells and drains for core regions, input/output (I/O) regions, and SONOS cell regions surrounded by isolation areas;
forming sequentially a blanket silicon oxide layer and a storage silicon nitride layer (NO layer) on said substrate;
patterning said NO layer leaving portions of said NO layer over said SONOS cell regions while exposing surface of said substrate over said core regions and said I/O regions;
forming a first gate oxide (ISSG) on said exposed surface, while partially oxidizing said silicon nitride layer to form a portion of a top silicon oxide layer;
patterning said first gate oxide to leave portions over said I/O regions while concurrently removing said first gate oxide over said core regions;
forming a second gate oxide over said core regions while concurrently increasing the thickness of said top silicon oxide layer to complete said SONOS memory cell and said first gate oxide and said second gate oxide each of a different thickness.

13. The method of claim 12, wherein said semiconductor substrate is single crystal silicon.

14. The method of claim 12, wherein said blanket silicon oxide layer is formed on said substrate by RTO or in-situ steam generation (ISSG) oxidation process to a thickness of between about 30 and 50 Angstroms.

15. The method of claim 12, wherein said storage silicon nitride is deposited by LPCVD using dichlorosilane and ammonia, and is formed to a thickness of between about 110 and 140 Angstroms.

16. The method of claim 12, wherein said first gate oxide is grown to a thickness of between 50 and 70 Angstroms.

17. The method of claim 12, wherein said first gate oxide is formed by ISSG while said portion of said top silicon oxide layer is formed to a thickness of between about 30 and 40 Angstroms.

18. The method of claim 12, wherein said second gate oxide is grown to a thickness of 30 and 40 Angstroms, and said top silicon oxide layer is increased in thickness to between about 50 and 60 Angstroms.

19. The method of claim 12, wherein said second gate oxide is formed by ISSG.

20. The method of claim 12, wherein a conducting metal layer is deposited and patterned to form gate electrodes over said first gate oxide, said second gate oxide and said SONOS cell regions.

* * * * *